United States Patent
Bouchet

(10) Patent No.: US 12,332,129 B2
(45) Date of Patent: Jun. 17, 2025

(54) STRAIN MEASURING ASSEMBLY

(71) Applicant: Ratier-Figeac SAS, Figeac (FR)

(72) Inventor: Arnaud Bouchet, Planioles (FR)

(73) Assignee: RATIER-FIGEAC SAS, Figeac (FR)

( * ) Notice: Subject to any disclaimer, the term of this patent is extended or adjusted under 35 U.S.C. 154(b) by 356 days.

(21) Appl. No.: 17/896,348

(22) Filed: Aug. 26, 2022

(65) Prior Publication Data

US 2023/0062399 A1 Mar. 2, 2023

(30) Foreign Application Priority Data

Sep. 2, 2021 (EP) ..................................... 21306201

(51) Int. Cl.
*G01L 1/22* (2006.01)
(52) U.S. Cl.
CPC ................................. *G01L 1/2287* (2013.01)
(58) Field of Classification Search
None
See application file for complete search history.

(56) References Cited

U.S. PATENT DOCUMENTS

| | | | |
|---|---|---|---|
| 4,649,758 A | 3/1987 | Harbour | |
| 5,668,480 A | 9/1997 | Nintzel | |
| 5,777,235 A | 7/1998 | Altwein | |
| 2002/0084776 A1* | 7/2002 | Barker | G06F 3/0346 |
| | | | 324/76.53 |
| 2008/0011064 A1* | 1/2008 | Masser | G01Q 10/06 |
| | | | 73/105 |

FOREIGN PATENT DOCUMENTS

GB 576639 A 4/1946

OTHER PUBLICATIONS

European Search Report for Application No. 21306201.1, mailed Feb. 9, 2022, 7 pages.

* cited by examiner

*Primary Examiner* — Jas A Sanghera
(74) *Attorney, Agent, or Firm* — CANTOR COLBURN LLP

(57) ABSTRACT

A strain gauge assembly includes: a strain gauge comprising a plurality of resistive elements connected as a Wheatstone bridge or half Wheatstone bridge; an excitation signal generator arranged to provide an excitation signal to two resistive elements of the strain gauge; phase shifting circuitry arranged to determine phase shifts in the excitation signal responsive to changes in resistance of the two resistive elements and an end stage configured to output a measure indicative of the phase shift as an indication of strain on the assembly.

8 Claims, 2 Drawing Sheets

STRAIN MEASURING ASSEMBLY

CROSS-REFERENCE TO RELATED APPLICATIONS

This application claims priority to European Patent Application No. 21306201.1 filed Sep. 2, 2021, the entire contents of which is incorporated herein by reference.

TECHNICAL FIELD

The present disclosure relates to an assembly and method for obtaining strain values from a strain gauge.

BACKGROUND

There are many applications where it is necessary to measure the torque or strain applied to a device or component. This can be done by means of a strain sensor or strain gauge (or gage) which is a sensor whose resistance varies with applied force. The strain gauge is located on the device or component whose strain (due to stress) is to be measured. As the device or component is displaced or deformed due to application of external forces, the strain gauge is correspondingly deformed and its electrical resistance varies accordingly. This can be measured to provide an indication of strain being measured.

Strain may be tensile or compressive which is indicated by a positive or negative sign of the strain gauge output.

A commonly used strain gauge is a Wheatstone bridge. A Wheatstone bridge consists of four resistive elements which are connected together into a diamond shaped configuration. Typically all four resistive elements are active strain gauges to maximise sensitivity of the transducer but in some cases two fixed resistors are used with two strain gauges instead. A Wheatstone bridge strain gauge circuit is created by mounting a pair of strain gauges on a material that will be stressed, so that when a force is applied, they will stretch along their width. Another pair of identical strain gauges are mounted in a direction at 90° to the first pair. The two strain gauges that are pointing tangentially will be stretched across their width which will decrease the resistance. The other two strain gauges which are pointing radially will be stretched along their length which will increase the resistance. Each strain gauge is connected to the next one to form a diamond shape, and the points of the diamond become the connection points providing power to the circuit and for measuring the signal generated. If a voltage supply is then applied across two opposite connection points of the Wheatstone bridge circuit, and a voltmeter is connected to the remaining two opposite connection points, a voltage drop will be detected which will vary depending on the stress applied to the surface on which the Wheatstone bridge circuit is mounted. Essentially, the ratio induced by the change in resistance acts as a voltage divider which provides a differential output value Vout indicative of the strain being measured. It is usually necessary to amplify the differential output to obtain a useful output, and it may also be necessary to adjust the output by adding potential offset. Because of this requirement, amplification components are required. These usually need to be located close to the strain gauge components to minimize any noise or adverse effects that would be caused by long cables between the sensor and the amplifier, especially for DC powered sensors. The distance between the amplifier and sensor can be greater for AC supplies. This adds to the complexity, cost and weight of the sensor and can be a problem in applications e.g. in aircraft, where there is limited space.

There is, therefore, a need for an improved strain gauge assembly that avoids the need for an amplifier, is simple and inexpensive, has high accuracy and reliability and is less susceptible to noise.

SUMMARY

According to one aspect of the disclosure, there is provided a strain gauge assembly comprising: a strain gauge comprising a plurality of resistive elements connected as a Wheatstone bridge or half Wheatstone bridge; an excitation signal generator arranged to provide an excitation signal to two resistive elements of the strain gauge; phase shifting circuitry arranged to determine phase shifts in the excitation signal responsive to changes in resistance of the two resistive elements; and an end stage comprising shaping circuitry to convert sine phase shifted signals into square signals and to output a measure indicative of the phase shift as an indication of strain on the assembly.

According to another aspect, there is provided a method of measuring strain comprising applying an excitation signal to resistive elements of a Wheatstone bridge or half Wheatstone bridge constrain gauge and determining the strain applied to the strain gauge from a measure of phase shift in the excitation signal.

BRIEF DESCRIPTION

Examples according to the disclosure will now be described with reference to the drawings. These are examples only and alternatives are possible within the scope of the invention as defined by the claims.

The operation of a conventional Wheatstone bridge strain gauge will first be briefly described with reference to FIG. 1. The strain gauge is formed as a strain gauge 1 which is located, in use, on the part whose strain is to be measured. The gauge comprises four resistors R1, R2, R3, R4 connected to each other, as described above, in a diamond configuration. The point between R1 and R2 is the 'high' end of the bridge and is connected to a power supply Vsensorsupply, via a sensor gain setting 2. The opposite end—the node between resistors R3 and R4—is connected to ground. As force is applied to the device or component to which the strain gauge is attached, the strain gauge twists or deforms, which results in a change in resistance. The effect is of a voltage divider and the resulting voltage difference between points A and B provides a measure of the strain. The voltage difference is then amplified by amplifier 3 adding potential offset. The amplifier 3 outputs a voltage Vmeasure as a readable measure of the strain.

As mentioned above, the amplifier has to be located close to the sensor (typically less than 30 cm). If the distance is greater, particularly for DC powered systems, losses increase and measurement accuracy can then only be maintained by use of a high gain amplifier. There may, therefore, be a desire to obtain a strain measurement from a Wheatstone bridge sensor without the need for the amplifier components.

According to the disclosure, this is achieved by using a phase shift in a reference signal applied to the sensor, caused by a change in resistance of the sensor, as a measure of strain. This will be described further with reference to FIGS. 2 and 3.

Figure 1:
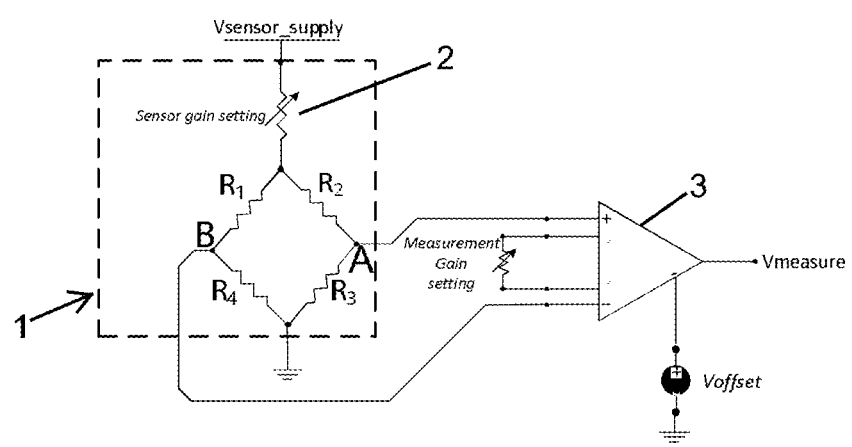
FIG. 1 shows a conventional strain gauge using a Wheatstone bridge circuit.
Figure 2:
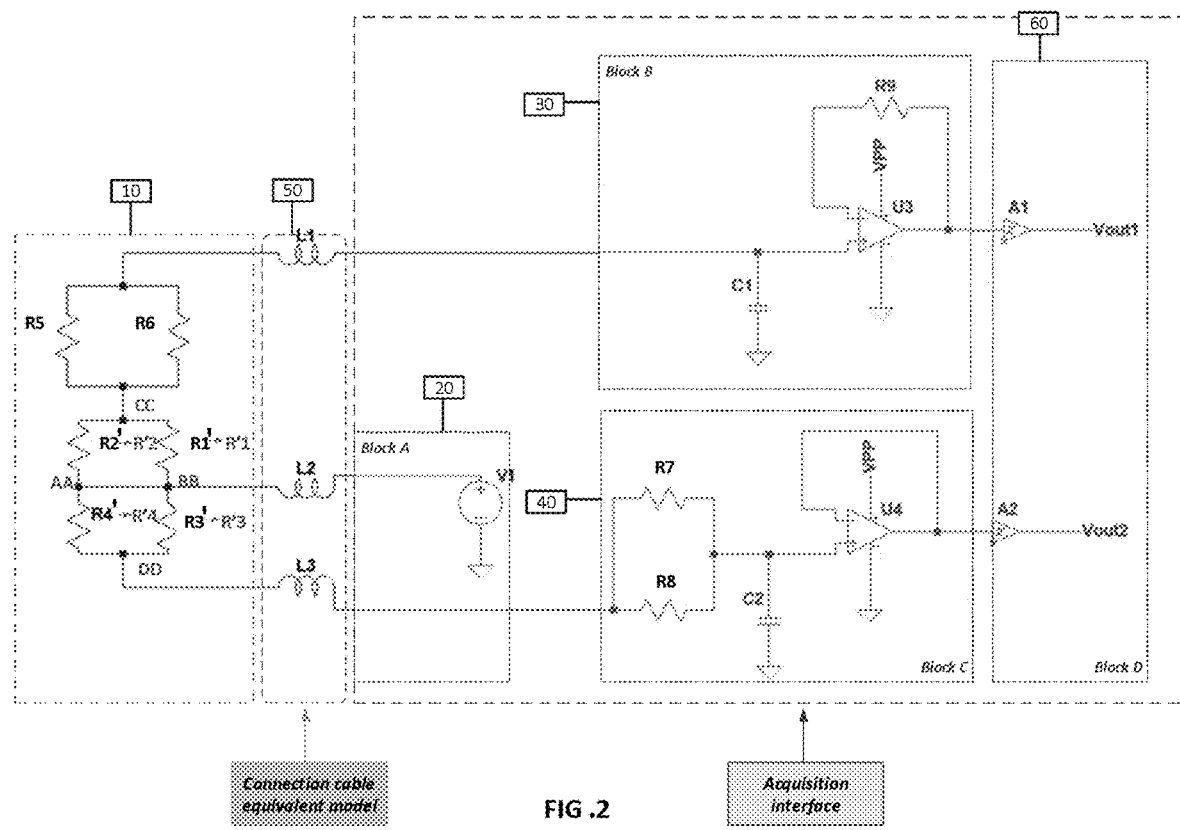
FIG. 2 shows a strain gauge circuit according to the disclosure.
Figure 3:
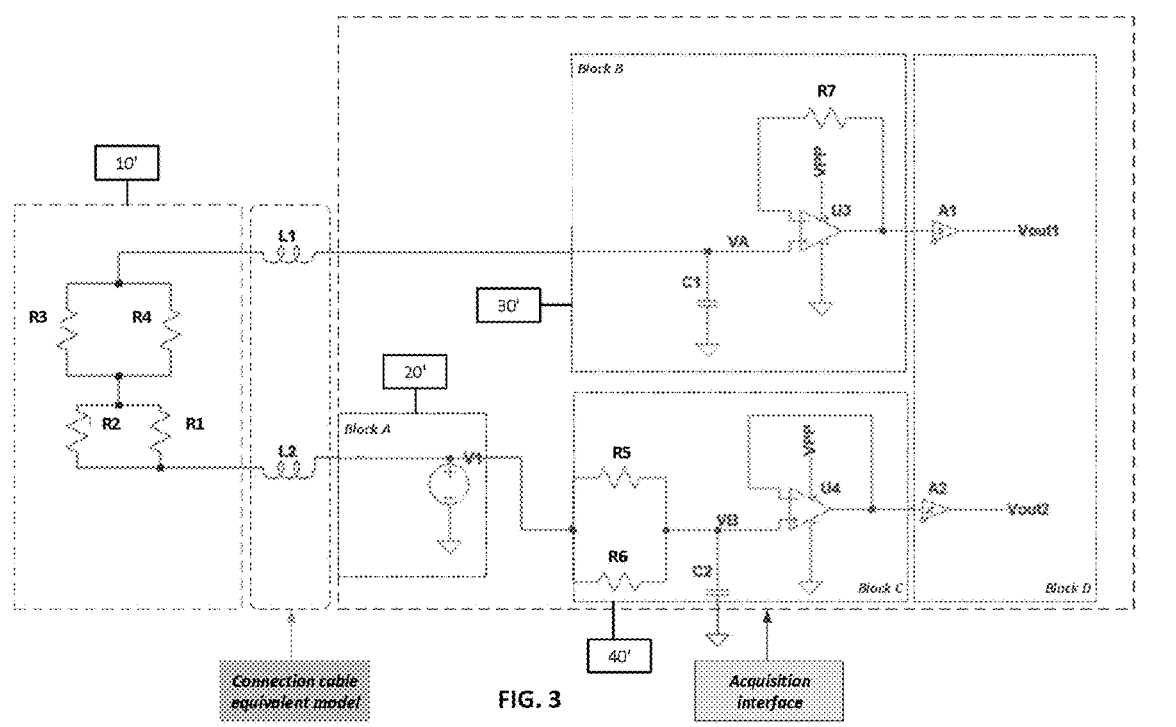
FIG. 3 shows an alternative strain gauge circuit according to the disclosure.

Referring first to FIG. 2, the assembly includes a strain gauge 10 which, in this example, is essentially the same as the conventional strain gauge of FIG. 1 and comprises four resistors R1', R2', R3' and R4' in a Wheatstone bridge configuration and gain setting resistors R5, R6. Instead of the amplifier block of the conventional assembly, the assembly of the disclosure includes an excitation signal generator block 20 and one or more (two, in FIG. 2) phase shifting circuits, which may include low pass filters, 30, 40. Because of the way the strain measurement is acquired according to the disclosure, as will be described further below, the generator 20 and the phase shifting blocks 30, 40 can be connected to the sensor 10 via a long cable (represented here by an equivalent model of inductors 50) without experiencing the problems described above. The generator and filters can, therefore, be located remote from the sensor.

In this description, 'phase shifting block' refers to a set of electronic circuitry that acts to generate a phase shift in its input signal, according the value of a distant resistance. This phase shifting block can be based on capacitive and/or inductive elements, and any requested active/passive component (for example, an operational amplifier).

According to the disclosure, the generator 20 generates an excitation signal, for example, a sinusoidal reference signal V1 that is applied to nodes AA and BB of the sensor bridge. As strain causes the sensor to deform and, therefore, the resistance values to change (R1' becomes R'1 and R2' becomes R'2). R'1 is in parallel to R'2. The resulting equivalent resistance (named Re1) then is modified under strain applied to the gauge. This equivalent resistance, together with R5, R6 and Block 30, provides a phase shifting stage with gain equal to 1. Then the equivalent resistance Re1 modification causes a phase shift between V1 (excitation reference voltage) and Vout1. In the same way, R4' is modified to R'4 and R3' is modified to R'3. R'4 is in parallel to R'3. The resulting equivalent resistance (named Re2) then is modified under strain applied to the gauge. This equivalent resistance, together with R7, R8 and Block 40, provides a phase shifting stage with gain equal to 1. Then the equivalent resistance Re2 modification causes a phase shift between V2 (excitation reference voltage) and Vout1. In an example, the blocks 30, 40 are identical except for additional resistors incorporated in one of the filters to ensure symmetry of the Wheatstone bridge acquisition.

To enable a determination to be made as to the direction of phase shift, indicative of the direction of strain, the sinusoidal outputs from the low pass filters are provided to an output stage 60 which may be e.g. a Schmitt trigger or other circuit to shape the output signals to create respective square waves or digital signals which can then be compared to determine the amount and direction of phase shift between the two outputs. This is done by measuring the relative time between the rising edge of one signal and the falling edge of the other output signal.

The output stage 60 may be e.g. a Schmitt trigger with threshold detection and hysteresis.

The example shown in FIG. 2 is for a full Wheatstone bridge. The principles of the disclosure can also be used with a half Wheatstone bridge 10' in which case, the signals compared are the phase shifted reference signal, as a first signal, and the original, unshifted, reference signal as the second signal. This can be seen in FIG. 3, where Vout1 from phase shifting block 30' is compared to a filtered version of the sinusoidal reference signal from the generator 20' output from the a low pass filter block 40' and the phase difference is determined in the same way as described for the example of FIG. 2 to determine the strain measurement.

By using signal shaping to allow comparison of square waves, it is not necessary to tune the gain of the signal according to accuracy of the strain gauge. Also, because the measurement is being performed between outputs of the same Wheatstone bridge, any offset induced by the strain gauge itself should be automatically compensated, thus avoiding the need for tuning in this respect.

To maximise accuracy and efficiency, to minimise gain attenuation while maximising induced phase shift due to the change in resistance of the strain gauge, the rating of an amplifier, the frequency of the sinusoidal reference signal and any capacitor and/or inductor values used in the phase shifting block should be appropriately selected. The time measurements can be performed e.g. using embedded resources of a motor control DSP, for example, thus minimising the need for extra resources or software.

The assembly of this disclosure, using changes in the strain gauge resistance to cause a phase shift in a reference signal, the phase shift providing a measure of strain, provides a simpler and more compact system than conventional systems such as shown in FIG. 1. The assembly is less susceptible to noise and perturbations and the measurement circuitry can be located remote from the strain gauge.

The invention claimed is:

1. A strain gauge assembly comprising:
    a strain gauge comprising a plurality of resistive elements connected as a Wheatstone bridge or half Wheatstone bridge;
    an excitation signal generator arranged to provide an excitation signal to two resistive elements of the strain gauge;
    phase shifting circuitry arranged to determine phase shifts in the excitation signal responsive to changes in resistance of the two resistive elements; and
    an end stage comprising shaping circuitry to convert sine phase shifted signals into square signals and to output a measure indicative of the phase shift as an indication of strain on the assembly;
    wherein the strain gauge comprises a full Wheatstone bridge comprising four resistive elements connected to each other in a diamond configuration,
    wherein the excitation signal is applied to two opposing points of the diamond configuration between resistive elements and the phase shifting circuitry is connected to receive outputs from the other two opposing points of the diamond configuration between resistive elements;
    wherein the phase shifting circuitry comprises two phase shifting blocks, the output from one of the points of the diamond configuration provided to the input of a first phase shifting block and the output from the opposing point provided to the input of a second phase shifting block, and
    wherein the phase shifting blocks provide, respectively, a first and a second phase shifted reference signal, the phase shift dependant on the difference in resistance of the respective resistive elements.

2. The strain gauge assembly of claim 1, wherein the phase shifting circuitry comprises one or more phase shifting block.

3. The strain gauge assembly of claim 1, wherein the excitation signal generator and phase shifting circuitry are connected to the strain gauge via a cable.

4. The strain gauge assembly of claim 1, wherein the strain gauge comprises a half Wheatstone bridge comprising two resistive elements, and
wherein the excitation signal is applied to one side of the resistive elements and the phase shifting circuitry comprises two phase shifting blocks, the output from the resistive elements provided to the input of a first phase shifting block and the output from the excitation signal generator provided to the input of a second phase shifting block, and
wherein the phase shifting blocks provide, respectively, a first and a second phase shifted reference signal, the phase shift dependant on the difference in resistance of the respective resistive elements.

5. A strain gauge assembly comprising:
a strain gauge comprising a plurality of resistive elements connected as a Wheatstone bridge or half Wheatstone bridge;
an excitation signal generator arranged to provide an excitation signal to two resistive elements of the strain gauge;
phase shifting circuitry arranged to determine phase shifts in the excitation signal responsive to changes in resistance of the two resistive elements; and
an end stage comprising shaping circuitry to convert sine phase shifted signals into square signals and to output a measure indicative of the phase shift as an indication of strain on the assembly;
wherein the strain gauge comprises a full Wheatstone bridge comprising four resistive elements connected to each other in a diamond configuration,
wherein the excitation signal is applied to two opposing points of the diamond configuration between resistive elements and the phase shifting circuitry is connected to receive outputs from the other two opposing points of the diamond configuration between resistive elements;
wherein the phase shifting circuitry comprises two phase shifting blocks, the output from one of the points of the diamond configuration provided to the input of a first phase shifting block and the output from the opposing point provided to the input of a second phase shifting block, and
wherein the phase shifting blocks provide, respectively, a first and a second phase shifted reference signal, the phase shift dependant on the difference in resistance of the respective resistive elements;
wherein the end stage is configured to shape the first and second phase shifted signals and compare the shaped signals to provide a phase difference output indicative of the strain to be measured.

6. The strain gauge assembly of claim 5, wherein the phase shifting circuitry comprises one or more phase shifting block.

7. The strain gauge assembly of claim 5, wherein the excitation signal generator and phase shifting circuitry are connected to the strain gauge via a cable.

8. The strain gauge assembly of claim 5, wherein the strain gauge comprises a half Wheatstone bridge comprising two resistive elements, and
wherein the excitation signal is applied to one side of the resistive elements and the phase shifting circuitry comprises two phase shifting blocks, the output from the resistive elements provided to the input of a first phase shifting block and the output from the excitation signal generator provided to the input of a second phase shifting block, and
wherein the phase shifting blocks provide, respectively, a first and a second phase shifted reference signal, the phase shift dependant on the difference in resistance of the respective resistive elements.

* * * * *